(12) United States Patent
Hwang et al.

(10) Patent No.: US 9,041,625 B2
(45) Date of Patent: May 26, 2015

(54) SUBPIXEL ARRANGEMENT STRUCTURE FOR A DISPLAY DEVICE AND DISPLAY DEVICE

(75) Inventors: Soonjae Hwang, Gumi-si (KR); Jongsik Shim, Seoul (KR); Homin Lim, Paju-si (KR); Minkyu Chang, Seoul (KR); Kyoungsik Choi, Daejeon (KR); Thomas Lloyd Credelle, Morgan Hill, CA (US)

(73) Assignee: LG DISPLAY CO., LTD., Seoul (KR)

( * ) Notice: Subject to any disclaimer, the term of this patent is extended or adjusted under 35 U.S.C. 154(b) by 670 days.

(21) Appl. No.: 13/085,120

(22) Filed: Apr. 12, 2011

(65) Prior Publication Data

US 2011/0260952 A1  Oct. 27, 2011

Related U.S. Application Data

(60) Provisional application No. 61/326,457, filed on Apr. 21, 2010.

(51) Int. Cl.
*G09G 3/20* (2006.01)
*G09G 5/02* (2006.01)
*G02F 1/1343* (2006.01)
*H01L 27/32* (2006.01)

(52) U.S. Cl.
CPC ............ *G09G 3/20* (2013.01); *G02F 1/134336* (2013.01); *G02F 2201/52* (2013.01); *G09G 2300/0452* (2013.01); *H01L 27/3218* (2013.01)

(58) Field of Classification Search
CPC .............. G09G 2300/0452; G09G 2300/0439; G09G 3/2003; G02F 2201/52; G02F 1/134336; H01L 27/3218
USPC ............................. 349/146; 345/694–696, 55
See application file for complete search history.

(56) References Cited

U.S. PATENT DOCUMENTS

| | | | | |
|---|---|---|---|---|
| 6,937,217 B2* | 8/2005 | Klompenhouwer et al. | ... | 345/87 |
| 2005/0068281 A1* | 3/2005 | Shin et al. | | 345/88 |
| 2008/0218461 A1* | 9/2008 | Sugita et al. | | 345/88 |
| 2009/0322215 A1* | 12/2009 | Sung et al. | | 313/504 |

\* cited by examiner

*Primary Examiner* — Lun-Yi Lao
*Assistant Examiner* — Ibrahim Khan
(74) *Attorney, Agent, or Firm* — Birch, Stewart, Kolasch & Birch, LLP

(57) ABSTRACT

A subpixel arrangement structure for a display device, including a plurality unit pixels each having a red subpixel, a green subpixel and a blue subpixel, wherein openings of the red and green subpixels of each unit pixel are aligned along a direction of a column axis, and wherein an opening of the blue subpixel of each unit pixel is aligned along a direction of a row axis that is perpendicular to the column axis or arranged in zigzags along the direction of the row axis.

17 Claims, 13 Drawing Sheets

(A) Existing RGB delta structure (B) Existing RGBG structure

SUBPIXEL ARRANGEMENT STRUCTURE FOR A DISPLAY DEVICE AND DISPLAY DEVICE

This application claims priority to and the benefit of U.S. Provisional Application No. 61/326,457 filed in the United States Patent and Trademark Office on Apr. 15, 2010, the entire contents of which are incorporated herein by reference.

BACKGROUND OF THE INVENTION

1. Field of the Invention

Embodiments of the invention relate to a subpixel arrangement structure for a display device.

2. Discussion of the Related Art

Examples of a display device include a cathode ray tube (CRT), a liquid crystal display (LCD), an organic light emitting diode (OLED) display, and a plasma display panel (PDP).

An active matrix type organic light emitting diode (AMOLED) display includes an organic light emitting diode (OLED) element having a self-emitting structure, and thus has advantages such as a fast response time, excellent light emitting efficiency, a high luminance, and a wide viewing angle. The AMOLED display controls a current flowing in an OLED (or the OLED element) using thin film transistors (TFTs), to thereby displaying an image.

The AMOLED display generally includes a plurality of red, green, and blue subpixels, so as to achieve a full color display. A RGB stripe structure illustrated in FIG. 1 is known as an arrangement structure of the subpixels of the AMOLED display.

As shown in FIG. 1, each of unit pixels formed on a display panel 10 includes a red subpixel SPR, a green subpixel SPG, and a blue subpixel SPB, which are positioned adjacent to one another in a horizontal direction. The red, green, and blue subpixels SPR, SPG, and SPB are arranged in a stripe form and are partitioned by a black region 11. OLEDs of the red, green, and blue subpixels SPR, SPG, and SPB have a red light emitting layer, a green light emitting layer, and a blue light emitting layer, respectively. The red, green, and blue light emitting layers of the red, green, and blue subpixels SPR, SPG, and SPB are separately deposited through a fine metal mask (FMM) method using a shadow mask.

The FMM method requires a process margin of a predetermined distance between the adjacent red, green, and blue subpixels SPR, SPG, and SPB. As a resolution of the display panel 10 increases, a distance between the subpixels decreases. Therefore, opening areas of the subpixels has to decrease so as to secure the process margin. However, when the opening areas decreases, an aperture ratio and a luminance of the display panel 10 are entirely reduced. Accordingly, because the display panel 10 having the RGB stripe structure has a high resolution limit, a new arrangement structure of subpixels has been demanded.

SUMMARY OF THE INVENTION

Embodiments of the invention provide a subpixel arrangement structure of a flat panel display device capable of increasing an aperture ratio and a luminance at a high resolution.

Embodiments of the invention also provide a subpixel arrangement structure of a flat panel display device capable of preventing a reduction in display quality while increasing an aperture ratio and a luminance.

In one aspect, there is a subpixel arrangement structure for a display device, comprising: a plurality of unit pixels each having a red subpixel, a green subpixel and a blue subpixel which form a delta arrangement structure, wherein openings of the red and green subpixels of each unit pixel are substantially aligned along a direction of a column axis, and wherein an opening of the blue subpixel of each unit pixel is substantially aligned along a direction of a row axis that is perpendicular to the column axis or arranged in zigzags along the direction of the row axis.

In another aspect, there is a display device, comprising: a plurality of pixel groups including twelve subpixels, and the twelve subpixels of each pixel group constitute four unit pixels, wherein each unit pixel which forms a delta arrangement structure includes a red subpixel, a green subpixel and a blue subpixel, wherein openings of the red and green subpixels of the each unit pixel are aligned along a direction of a column axis, and wherein an opening of the blue subpixel of the each unit pixel is aligned along a direction of a row axis that is perpendicular to the column axis or arranged in zigzags along the direction of the row axis.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the invention examples of which are illustrated in the accompanying drawings.

Figure 1:
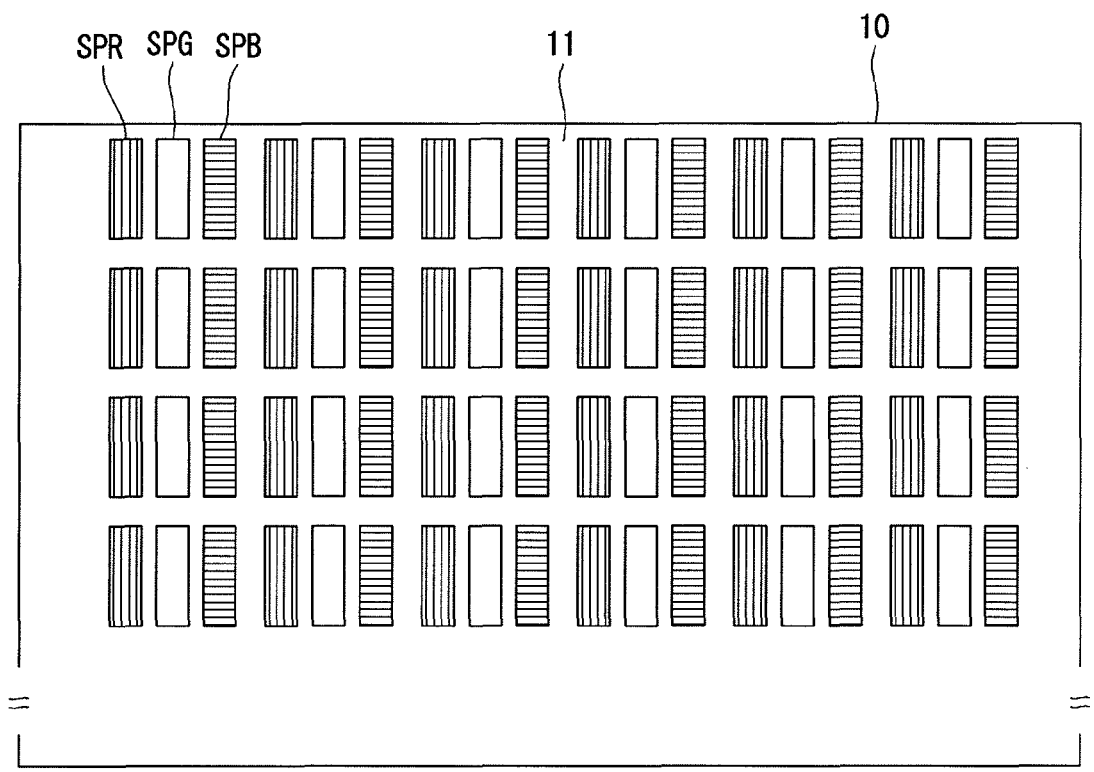
FIG. 1 illustrates a related art RGB stripe arrangement structure of subpixels.
Figure 2:
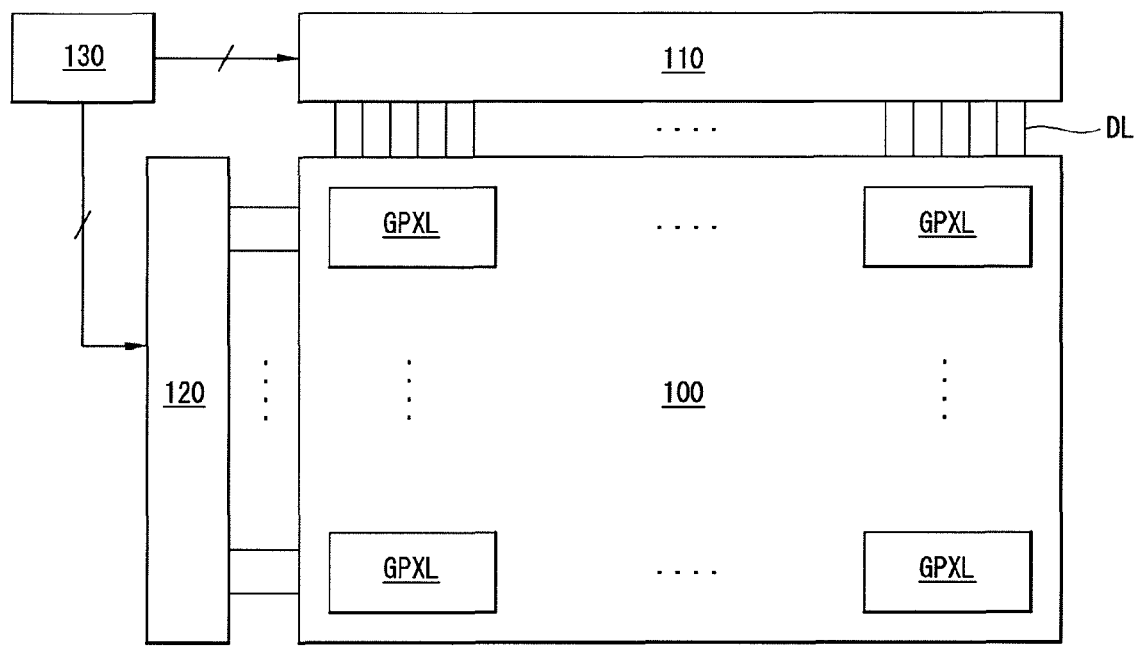
FIG. 2 schematically illustrates a flat panel display device according to an example embodiment of the invention.

FIG. 2 schematically illustrates a flat panel display device according to an example embodiment of the invention.

As shown in FIG. 2, a flat panel display device according to an example embodiment of the invention includes a display panel 100, a data driving circuit 110, a gate driving circuit 120, and a timing controller 130.

The display panel 100 may be implemented by an organic light emitting diode (OLED) panel. Further, the display panel 100 applicable to the example embodiment of the invention may be implemented by a liquid crystal display panel, a plasma display panel, and an electrophoresis display panel.

The display panel 100 includes a plurality of pixel groups GPXL. Each pixel group GPXL includes four unit pixels (=two unit pixels×two unit pixels). Each of first to fourth unit pixels constituting one pixel group GPXL includes three subpixels (i.e., red, green, and blue subpixels) having a delta arrangement structure, so as to have an increase or improved aperture ratio.

Each pixel group GPXL includes 12 subpixels, and one unit pixel includes three subpixels (i.e., red, green, and blue subpixels) having the delta structure. In other words, red, green, and blue subpixels of each pixel group GPXL constitute four unit pixels each having the delta structure. A plurality of data lines DL (for example, 6 data lines) and a plurality of gate lines GL (for example, 2 gate lines) may be assigned to each pixel group GPXL.

The red subpixel includes a red OLED having a red light emitting layer, the green subpixel includes a green OLED having a green light emitting layer, and the blue subpixel includes a blue OLED having a blue light emitting layer. The OLED further includes a first electrode (for example, a cathode electrode) stacked on the light emitting layer and a second electrode (for example, an anode electrode) stacked under the light emitting layer. The OLED emits light in a top emission type fashion. The light emitting layer emits light by a driving current applied from a thin film transistor (TFT) array via the second electrode.

Openings of 4 red subpixels and 4 green subpixels among 12 subpixels of one pixel group GPXL are aligned along a direction of a column axis (refer to FIGS. 3 and 7 to 13). Openings of 4 blue subpixels among the 12 subpixels are aligned along a direction of a row axis (refer to FIGS. 3 and 7 to 13) or are positioned in zigzags (refer to FIG. 13). In the embodiment of the invention, an opening indicates a display area of an image displayed by light produced in the light emitting layer.

The data driving circuit 110 includes a plurality of source driver integrated circuits (ICs) and drives the data lines DL of the display panel 100. The data driving circuit 110 converts input digital video data into a data voltage under the control of the timing controller 130 and supplies the data voltage to the data lines DL. The data voltage is applied to the TFT array through the data lines DL and determines a driving current, which is supplied from a driving element to the second electrode.

The gate driving circuit 120 includes at least one gate driver IC and sequentially supplies a scan pulse (or a gate pulse) to the gate lines GL of the display panel 100. In a gate in panel (GIP) manner, the gate driving circuit 120 may include a shift register formed on the display panel 100.

The timing controller 130 receives a plurality of timing signals from an external system and generates control signals for controlling operation timings of the data driving circuit 110 and the gate driving circuit 120. The timing controller 130 receives the digital video data from the external system and supplies the digital video data to the data driving circuit 110.

Figure 3:
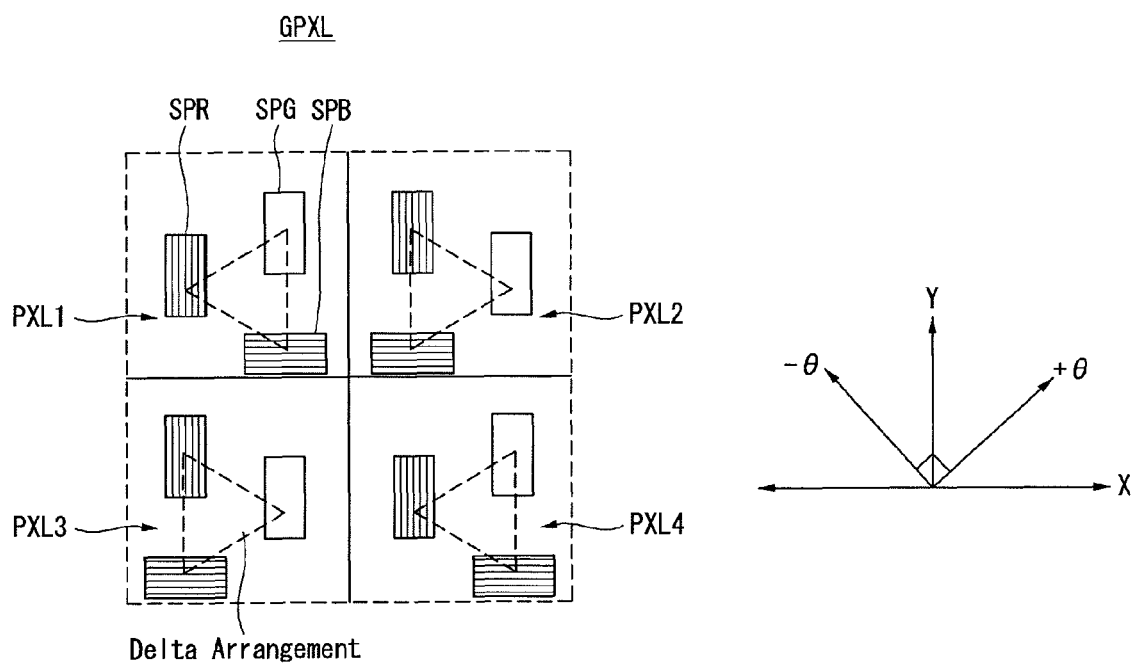
FIG. 3 illustrates one pixel group of a flat panel display device according to a first example embodiment of the invention.
Figure 3:
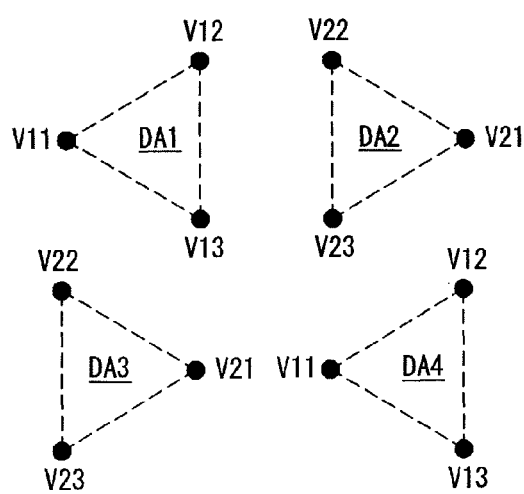

FIG. 3 illustrates one pixel group of a flat panel display device according to a first example embodiment of the invention.

As shown in FIG. 3, a pixel group GPXL includes a first unit pixel PXL1, a second unit pixel PXL2 positioned adjacent to the first unit pixel PXL1 in a direction of a row axis (i.e., X-axis direction), a third unit pixel PXL3 positioned adjacent to the first unit pixel PXL1 in a direction of a column axis (i.e., Y-axis direction), and a fourth unit pixel PXL4 positioned adjacent to the second unit pixel PXL2 in the Y-axis direction.

The first unit pixel PXL1 includes a red subpixel SPR, a green subpixel SPG positioned at the lateral side of the red subpixel SPR, and a blue subpixel SPB positioned at the lower side of the green subpixel SPG, thereby forming a first delta arrangement DA1. In a triangle structure of the first delta arrangement DA1 obtained by connecting central points (or internal points) of the red, green, and blue subpixels SPR, SPG, and SPB to one another, a 1-1 vertex V11 corresponds to the red subpixel SPR, a 1-2 vertex V12 corresponds to the green subpixel SPG, and a 1-3 vertex V13 corresponds to the blue subpixel SPB.

The second unit pixel PXL2 includes a red subpixel SPR, a green subpixel SPG positioned at the lateral side of the red subpixel SPR, and a blue subpixel SPB positioned at the lower side of the red subpixel SPR, thereby forming a second delta arrangement DA2. In a triangle structure of the second delta arrangement DA2 obtained by connecting central points (or internal points) of the red, green, and blue subpixels SPR, SPG, and SPB to one another, a 2-1 vertex V21 corresponds to the green subpixel SPG, a 2-2 vertex V22 corresponds to the red subpixel SPR, and a 2-3 vertex V23 corresponds to the blue subpixel SPB. The second delta arrangement DA2 is symmetrical to the first delta arrangement DA1 with respect to the 2-1 vertex V21.

The third unit pixel PXL3 includes a red subpixel SPR, a green subpixel SPG positioned at the lateral side of the red subpixel SPR, and a blue subpixel SPB positioned at the lower side of the red subpixel SPR, thereby forming a third delta arrangement DA3. A triangle structure of the third delta arrangement DA3 is substantially the same as the triangle structure of the second delta arrangement DA2.

The fourth unit pixel PXL4 includes a red subpixel SPR, a green subpixel SPG positioned at the lateral side of the red subpixel SPR, and a blue subpixel SPB positioned at the lower side of the green subpixel SPG, thereby forming a fourth delta arrangement DA4. A triangle structure of the fourth delta arrangement DA4 is substantially the same as the triangle structure of the first delta arrangement DA1. The fourth delta arrangement DA4 is symmetrical to the third delta arrangement DA3 with respect to the 1-2 vertex V12 and the 1-3 vertex V13.

In the first to fourth unit pixels PXL1-PXL4, the red and green subpixels SPR and SPG may have a rectangular shape in which long sides thereof are positioned in the Y-axis direction, and the blue subpixels SPB may have a rectangular shape in which long sides thereof are positioned in the X-axis direction. Further, a distance between the blue subpixels SPB in the first and second unit pixels PXL1 and PXL2 is less than a distance between the blue subpixels SPB in the third and fourth unit pixels PXL3 and PXL4.

A reason to arrange the subpixels of each of the first to fourth unit pixels PXL1-PXL4 in the delta structure is to increase the aperture ratio. The first and fourth delta arrangements DA1 and DA4 of the first and fourth unit pixels PXL1 and PXL4 are substantially the same as each other in a direction of a first inclined axis (i.e., −θ-axis direction). The second and third delta arrangements DA2 and DA3 of the second and third unit pixels PXL2 and PXL3 are substantially the same as each other in a direction of a second inclined axis (i.e., +θ-axis direction) perpendicular to the first inclined axis. Thus, the first and fourth unit pixels PXL1 and PXL4 have translational symmetry in the direction of the first inclined axis (i.e., −θ-axis direction), and the second and third unit pixels PXL2 and PXL3 have translational symmetry in the direction of the second inclined axis (i.e., +θ-axis direction).

Further, the triangle structures of the first and second delta arrangements DA1 and DA2 of the first and second unit pixels PXL1 and PXL2 form the line symmetry with respect to the Y-axis direction. The triangle structures of the third and fourth delta arrangements DA3 and DA4 of the third and fourth unit pixels PXL3 and PXL4 form the line symmetry with respect to the Y-axis direction.

As a result, the vertices V11 and V21 arranged along the X-axis direction in the first and second unit pixels PXL1 and PXL2 face in opposite directions, and the vertices V11 and V21 arranged along the X-axis direction in the third and fourth unit pixels PXL3 and PXL4 face each other.

Figure 4:
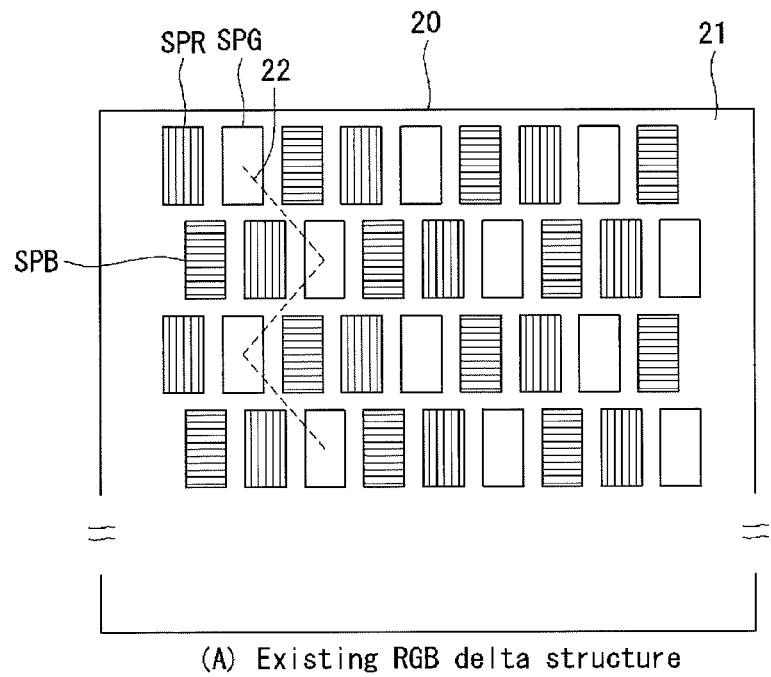
FIG. 4 illustrates an existing RGB delta structure and an existing RGBG subpixel arrangement structure.
Figure 4:
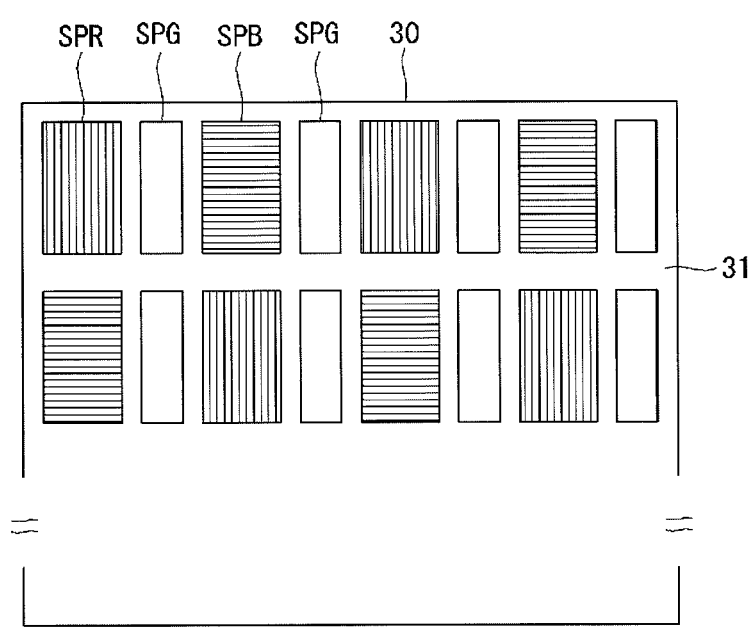

An RGB delta structure shown in (A) of FIG. 4 is a method for increasing the aperture ratio. As shown in (A) of FIG. 4, each of a plurality of unit pixels formed on a display panel 20 is disposed in a triangle shape and includes a red subpixel SPR, a green subpixel SPG, and a blue subpixel SPB, that are partitioned by a black region 21. This existing RGB delta structure is effective at increasing the aperture ratio. However, because the subpixels (for example, the green subpixels SPG) of the same color are disposed in zigzags in a column direction, a straight line is displayed in a wavy shape 22. Therefore, the display panel 20 having the existing RGB delta structure is unsuitable to display texts.

An RGBG structure shown in (B) of FIG. 4 is well known as another method for increasing the aperture ratio. As shown in (B) of FIG. 4, each of a plurality of pixel groups formed on a display panel 30 includes four unit pixels. Each pixel group includes 8 subpixels, i.e., 4 green subpixels SPG, 2 red subpixels SPR, and 2 blue subpixels SPB, that are partitioned by a black region 21. The existing RGBG structure is effective at increasing the aperture ratio. However, because the pixel group including the four unit pixels includes only the 2 red subpixels SPR and only the 2 blue subpixels SPB, an image displayed on the display panel 30 is not clear. Hence, the image quality thereof is reduced.

The embodiment of the invention arranges the subpixels using the following method, so as to solve the problems of the existing subpixel structures shown in FIG. 4 while increasing the aperture ratio through the delta arrangement of the subpixels.

In the first to fourth unit pixels PXL1-PXL4, openings of the red subpixels SPR and openings of the green subpixels SPG are aligned along the Y-axis direction. Because the openings of the red and green subpixels SPR and SPG relatively contribute the majority of the luminance, the alignment in the Y-axis direction, i.e., the vertical alignment greatly improves the display quality, particularly, text readability and also increases the image quality.

In the first to fourth unit pixels PXL1-PXL4, openings of the blue subpixels SPB are aligned along the X-axis direction and are staggered along the Y-axis direction. Even if the openings of the blue subpixels SPB are staggered as in the embodiment of the invention, the blue subpixels SPB do not greatly affect the display quality because of a relatively small contribution of the openings of the blue subpixels SPB to the luminance. The staggered structure of the blue subpixels SPB provides convenience to a process for forming the red and green light emitting layers using a fine metal mask (FMM) method.

The operation effect may be applied to the following example embodiments of the invention.

Figure 5:
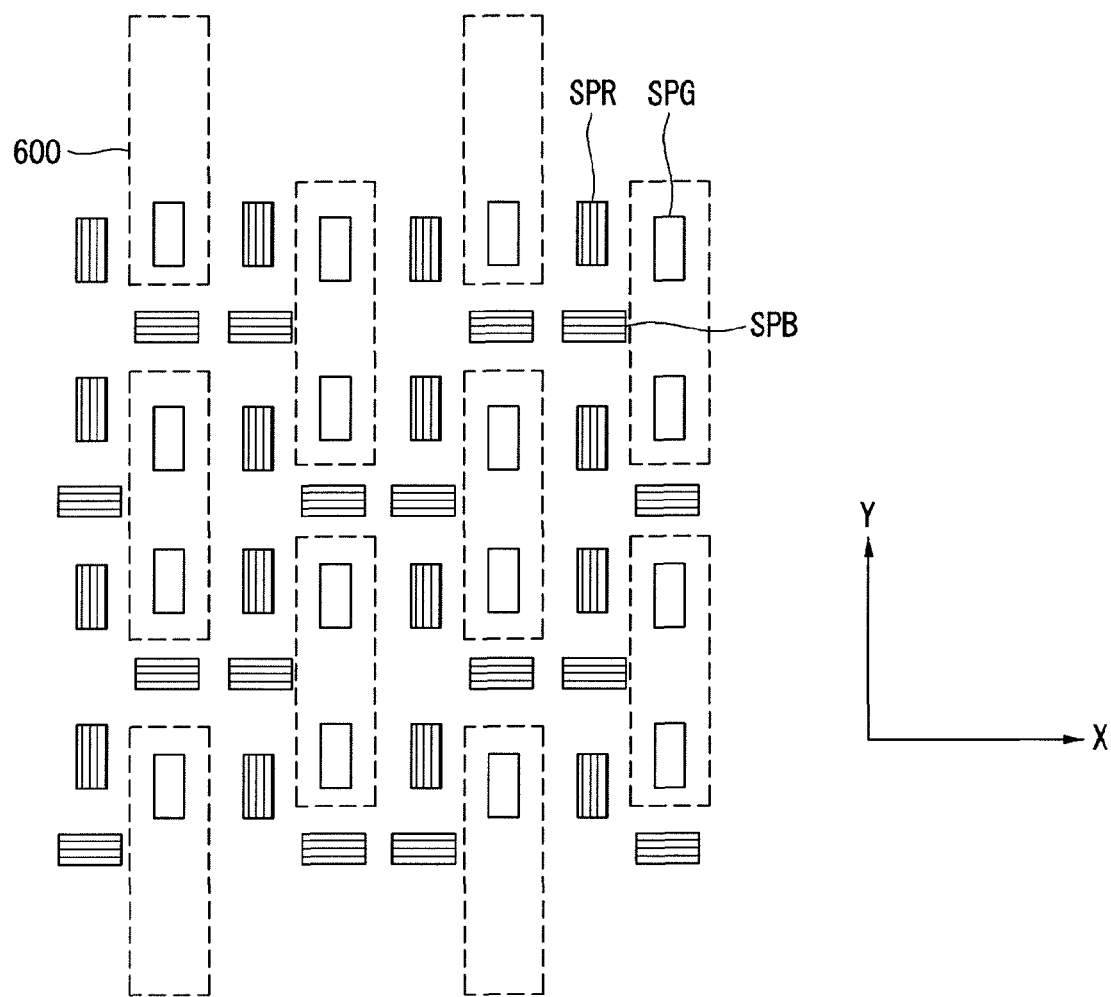
FIG. 5 illustrates an opening of a shadow mask aligned in a direction of a column axis for forming a green light emitting layer using a fine metal mask (FMM) method.

FIG. 5 illustrates openings 600 of a shadow mask aligned in the Y-axis direction for forming the green light emitting layer using the FMM method. In it is not shown in FIG. 5, the shadow mask for forming the red light emitting layer is aligned in the Y-axis direction. It is preferable, but not required, that the green and red subpixels SPG and SPR are not completely aligned in the X-axis direction so as to secure a process margin. The two green light emitting layers or the two red light emitting layers may be deposited through one opening 600 of the shadow mask. Because the openings 600 of the shadow mask are disposed in zigzags along the X-axis direction in conformity with the disposition configuration of the green subpixels or the red subpixels, the firmness of the shadow mask may be improved. Thus, because the size of the openings of the subpixels does not have to decrease so as to secure the process margin in a high resolution panel, the aperture ratio of the display panel entirely increases.

Figure 6:
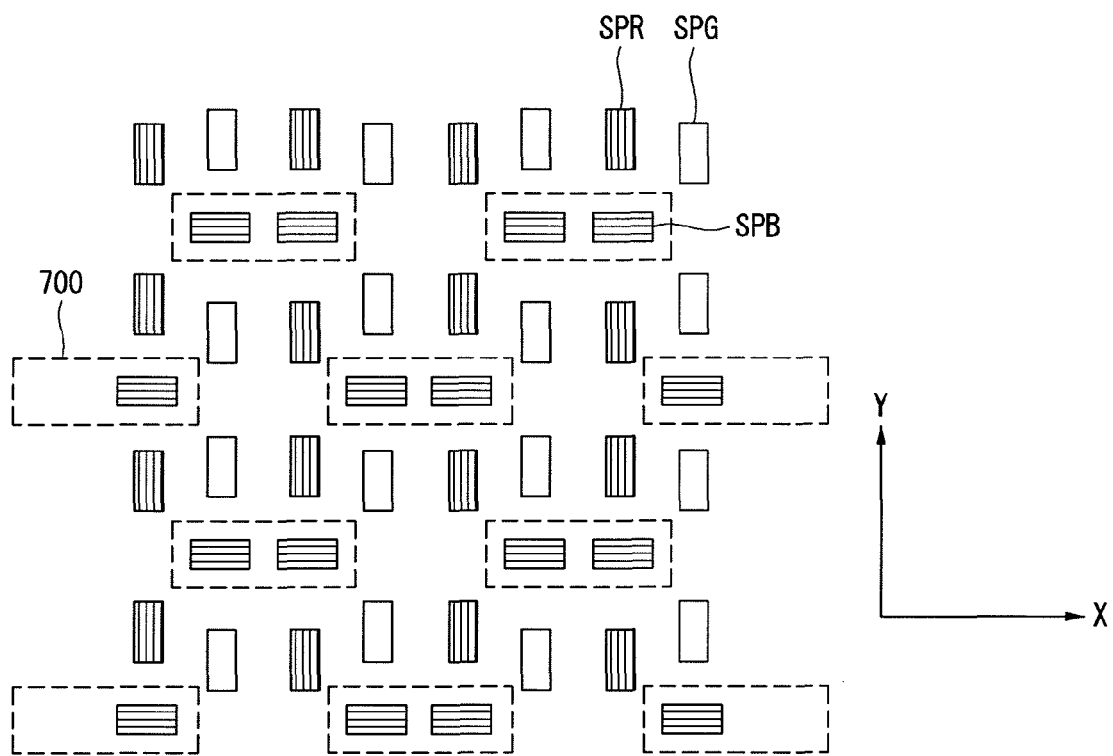
FIG. 6 illustrates an opening of a shadow mask aligned in a direction of a row axis for forming a blue light emitting layer using a fine metal mask (FMM) method.

FIG. 6 illustrates openings 700 of a shadow mask aligned in the X-axis direction for forming the blue light emitting layer using the FMM method. The two blue light emitting layers may be deposited through one opening 700 of the shadow mask. The openings 700 of the shadow mask are disposed in zigzags along the X-axis or Y-axis direction in conformity with the disposition configuration of the blue subpixels.

Figure 7:
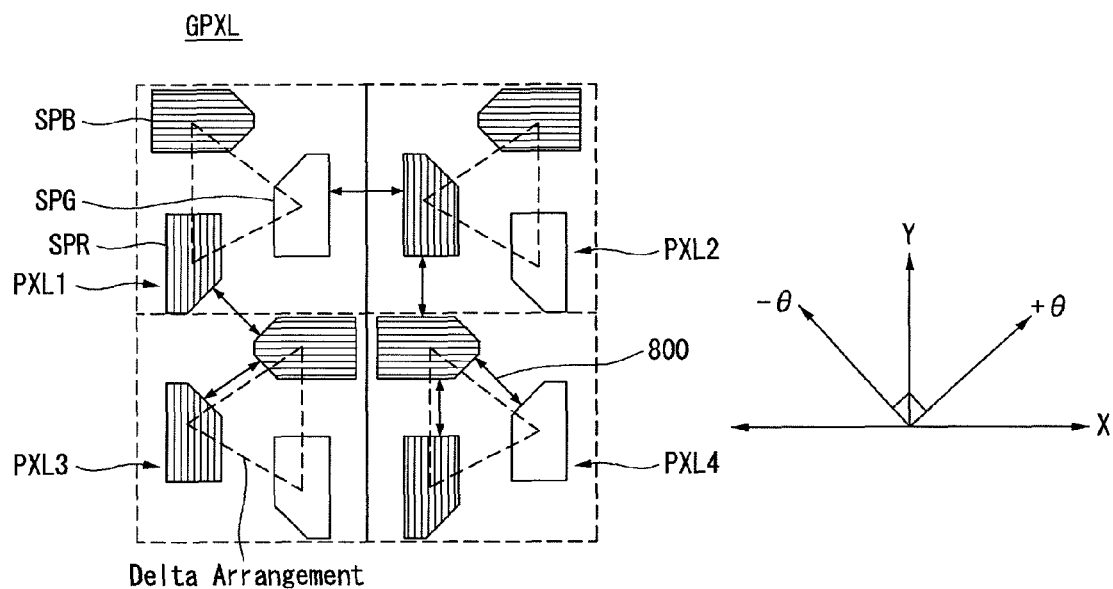
FIG. 7 illustrates a modification of a pixel group shown in FIG. 3.
Figure 7:
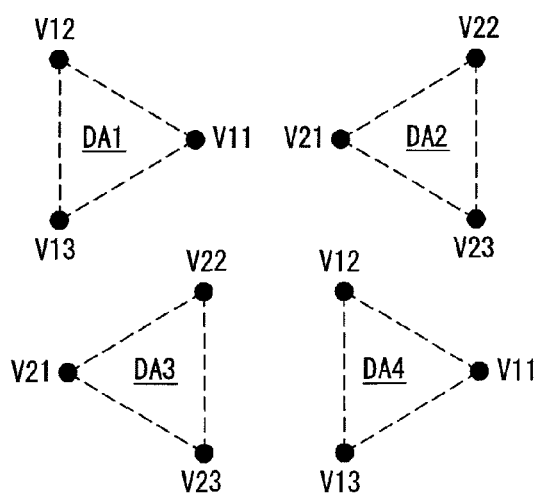

FIG. 7 illustrates a modification of the pixel group GPXL shown in FIG. 3.

As shown in FIG. 7, a pixel group GPXL includes a first unit pixel PXL1, a second unit pixel PXL2 positioned adjacent to the first unit pixel PXL1 in the X-axis direction, a third unit pixel PXL3 positioned adjacent to the first unit pixel PXL1 in the Y-axis direction, and a fourth unit pixel PXL4 positioned adjacent to the second unit pixel PXL2 in the Y-axis direction.

The first unit pixel PXL1 includes a red subpixel SPR, a blue subpixel SPB positioned at the upper side of the red subpixel SPR, and a green subpixel SPG positioned at the lateral side of the red subpixel SPR, thereby forming a first delta arrangement DA1. In a triangle structure of the first delta arrangement DA1 obtained by connecting central points points (or internal points) of the red, green, and blue subpixels SPR, SPG, and SPB to one another, a 1-1 vertex V11 corresponds to the green subpixel SPG, a 1-2 vertex V12 corresponds to the blue subpixel SPB, and a 1-3 vertex V13 corresponds to the red subpixel SPR.

The second unit pixel PXL2 includes a red subpixel SPR, a green subpixel SPG positioned at the lateral side of the red subpixel SPR, and a blue subpixel SPB positioned at the upper side of the green subpixel SPG, thereby forming a second delta arrangement DA2. In a triangle structure of the second delta arrangement DA2 obtained by connecting central points points (or internal points) of the red, green, and blue subpixels SPR, SPG, and SPB to one another, a 2-1 vertex V21 corresponds to the red subpixel SPR, a 2-2 vertex V22 corresponds to the blue subpixel SPB, and a 2-3 vertex V23 corresponds to the green subpixel SPG.

The third unit pixel PXL3 includes a red subpixel SPR, a green subpixel SPG positioned at the lateral side of the red subpixel SPR, and a blue subpixel SPB positioned at the upper side of the green subpixel SPG, thereby forming a third delta arrangement DA3. A triangle structure of the third delta arrangement DA3 is substantially the same as the triangle structure of the second delta arrangement DA2.

The fourth unit pixel PXL4 includes a red subpixel SPR, a blue subpixel SPB positioned at the upper side of the red subpixel SPR, and a green subpixel SPG positioned at the lateral side of the red subpixel SPR, thereby forming a fourth delta arrangement DA4. A triangle structure of the fourth delta arrangement DA4 is substantially the same as the triangle structure of the first delta arrangement DA1.

A distance between the blue subpixels SPB in the first and second unit pixels PXL1 and PXL2 is greater than a distance between the blue subpixels SPB in the third and fourth unit pixels PXL3 and PXL4.

A reason to arrange the subpixels of each of the first to fourth unit pixels PXL1-PXL4 in the delta structure is to increase the aperture ratio. The first and fourth delta arrangements DA1 and DA4 of the first and fourth unit pixels PXL1 and PXL4 are substantially the same as each other in a direction of a first inclined axis (i.e., $-\theta$-axis direction). The second and third delta arrangements DA2 and DA3 of the second and third unit pixels PXL2 and PXL3 are substantially the same as each other in a direction of a second inclined axis (i.e., $+\theta$-axis direction) perpendicular to the first inclined axis. Thus, the first and fourth unit pixels PXL1 and PXL4 have translational symmetry in the direction of the first inclined axis (i.e., $-\theta$-axis direction), and the second and third unit pixels PXL2 and PXL3 have translational symmetry in the direction of the second inclined axis (i.e., $+\theta$-axis direction).

Further, the triangle structures of the first and second delta arrangements DA1 and DA2 of the first and second unit pixels PXL1 and PXL2 form the line symmetry with respect to the Y-axis direction. The triangle structures of the third and fourth delta arrangements DA3 and DA4 of the third and fourth unit pixels PXL3 and PXL4 form the line symmetry with respect to the Y-axis direction.

As a result, the vertices V11 and V21 arranged along the X-axis direction in the first and second unit pixels PXL1 and PXL2 face each other, and the vertices V11 and V21 arranged along the X-axis direction in the third and fourth unit pixels PXL3 and PXL4 face in opposite directions.

In the first to fourth unit pixels PXL1-PXL4, openings of the red subpixels SPR and openings of the green subpixels SPG are aligned along the Y-axis direction. Openings of the blue subpixels SPB are aligned along the X-axis direction and are staggered along the Y-axis direction.

In the first to fourth unit pixels PXL1-PXL4, the subpixels may have a polygonal shape having five or more sides. For example, the red and green subpixels SPR and SPG may have a pentagonal shape, and the blue subpixels SPB may have a hexagonal shape. In the embodiment of the invention, a reason to form the subpixels in the polygonal shape is to further increase the aperture ratio by keeping a distance between the subpixels of the different colors constant as indicated by an arrow 800 of FIG. 7. Further, another reason is to optimize the FMM process.

Figure 8:
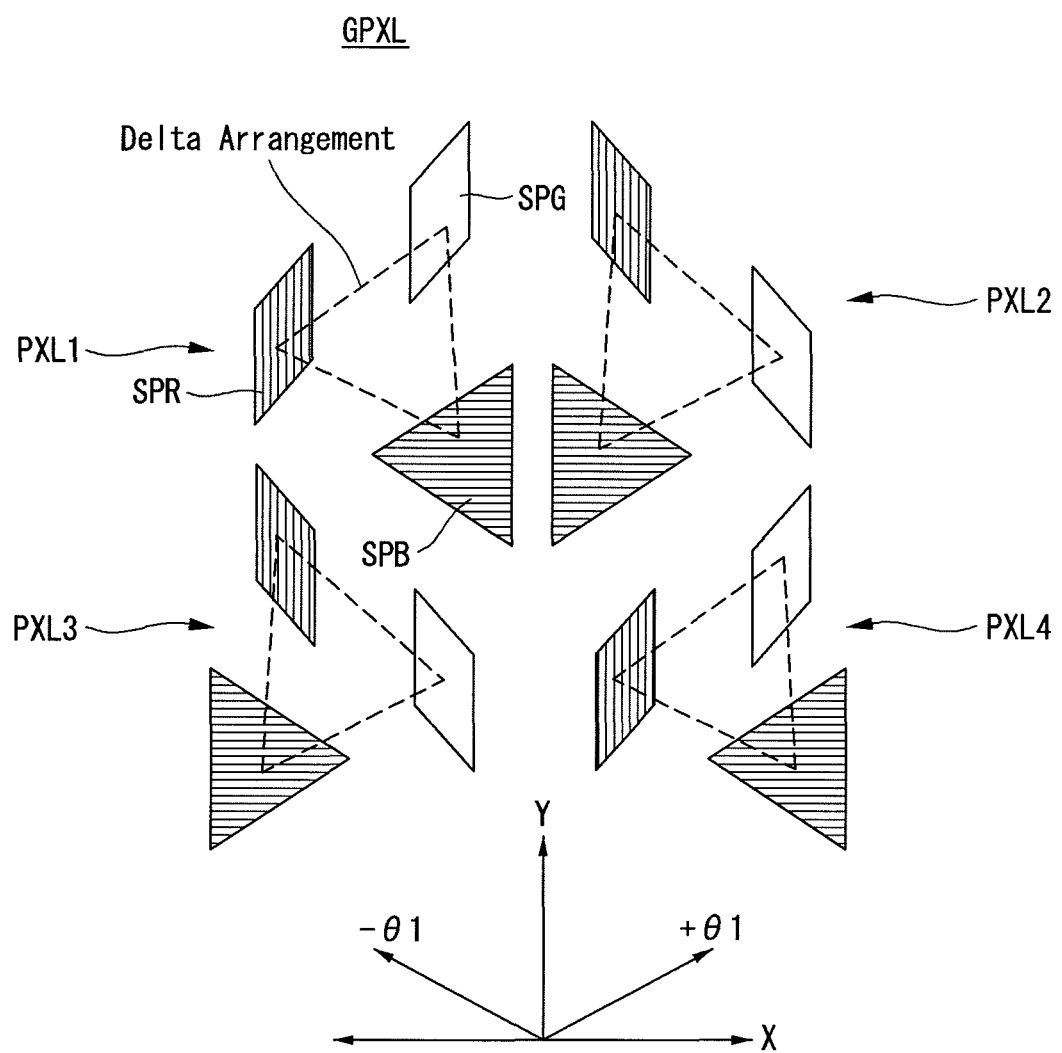
FIG. 8 illustrates one pixel group of a flat panel display device according to a second example embodiment of the invention.

FIG. 8 illustrates one pixel group of a flat panel display device according to a second example embodiment of the invention.

A pixel group GPXL shown in FIG. 8 is substantially the same as the pixel group GPXL shown in FIG. 3 in a delta arrangement structure of subpixels, except for the shape of the subpixels. In first to fourth unit pixels PXL1-PXL4 shown in FIG. 8, red and green subpixels SPR and SPG may have a parallelogram shape, and blue subpixels SPB may have an equilateral triangle shape.

In each of the first and fourth unit pixels PXL1 and PXL4, a first side of the blue subpixel SPB is disposed in the Y-axis direction, and inclined sides of the red and green subpixels SPR and SPG opposite a second side of the blue subpixel SPB are disposed in a direction of a first inclined axis (i.e., $+\theta1$-axis direction).

In each of the second and third unit pixels PXL2 and PXL3, a first side of the blue subpixel SPB is disposed in the Y-axis direction, and inclined sides of the red and green subpixels SPR and SPG opposite a second side of the blue subpixel SPB are positioned in a direction of a second inclined axis (i.e., $-\theta1$-axis direction).

The first side of the blue subpixel SPB of the first unit pixel PXL1 is parallel to and opposite to the first side of the blue subpixel SPB of the second unit pixel PXL2 in the Y-axis direction. The first side of the blue subpixel SPB of the third unit pixel PXL3 is parallel to and is not opposite to the first side of the blue subpixel SPB of the fourth unit pixel PXL4 in the Y-axis direction.

Among distances between the blue subpixels SPB of the first to fourth unit pixels PXL1-PXL4, a distance between the blue subpixels SPB of the first and second unit pixels PXL1 and PXL2 is shorter, and a distance between the blue subpixels SPB of the third and fourth unit pixels PXL3 and PXL4 longer.

Figure 9:
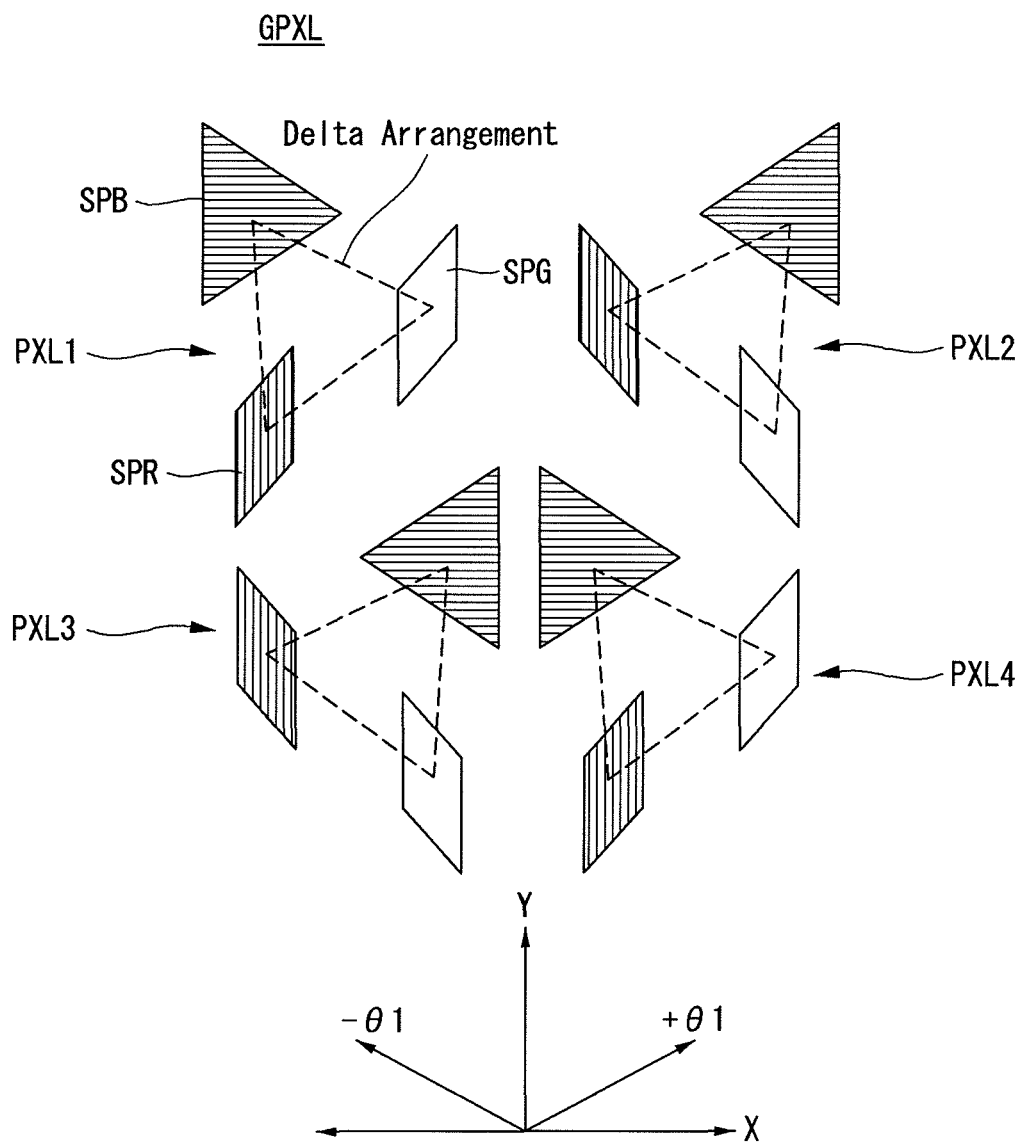
FIG. 9 illustrates a modification of a pixel group shown in FIG. 8.

FIG. 9 illustrates a modification of the pixel group shown in FIG. 8.

A pixel group GPXL shown in FIG. 9 is substantially the same as the pixel group GPXL shown in FIG. 7 in a delta arrangement structure of subpixels, except for the shape of the subpixels. In first to fourth unit pixels PXL1-PXL4 shown in FIG. 9, red and green subpixels SPR and SPG may have a parallelogram shape, and blue subpixels SPB may have an equilateral triangle shape.

In each of the first and fourth unit pixels PXL1 and PXL4, a first side of the blue subpixel SPB is disposed in the Y-axis direction, and inclined sides of the red and green subpixels SPR and SPG opposite a second side of the blue subpixel SPB are disposed in a direction of a first inclined axis (i.e., $+\theta1$-axis direction).

In each of the second and third unit pixels PXL2 and PXL3, a first side of the blue subpixel SPB is disposed in the Y-axis direction, and inclined sides of the red and green subpixels SPR and SPG opposite a second side of the blue subpixel SPB are positioned in a direction of a second inclined axis (i.e., $-\theta1$-axis direction).

The first side of the blue subpixel SPB included in the first unit pixel PXL1 is parallel to and is not opposite to the first side of the blue subpixel SPB included in the second unit pixel PXL2 in the Y-axis direction. The first side of the blue subpixel SPB of the third unit pixel PXL3 is parallel to and opposite to the first side of the blue subpixel SPB of the fourth unit pixel PXL4 in the Y-axis direction.

Among distances between the blue subpixels SPB of the first to fourth unit pixels PXL1-PXL4, a distance between the blue subpixels SPB of the first and second unit pixels PXL1 and PXL2 is longer, and a distance between the blue subpixels SPB of the third and fourth unit pixels PXL3 and PXL4 is shorter.

Figure 10:
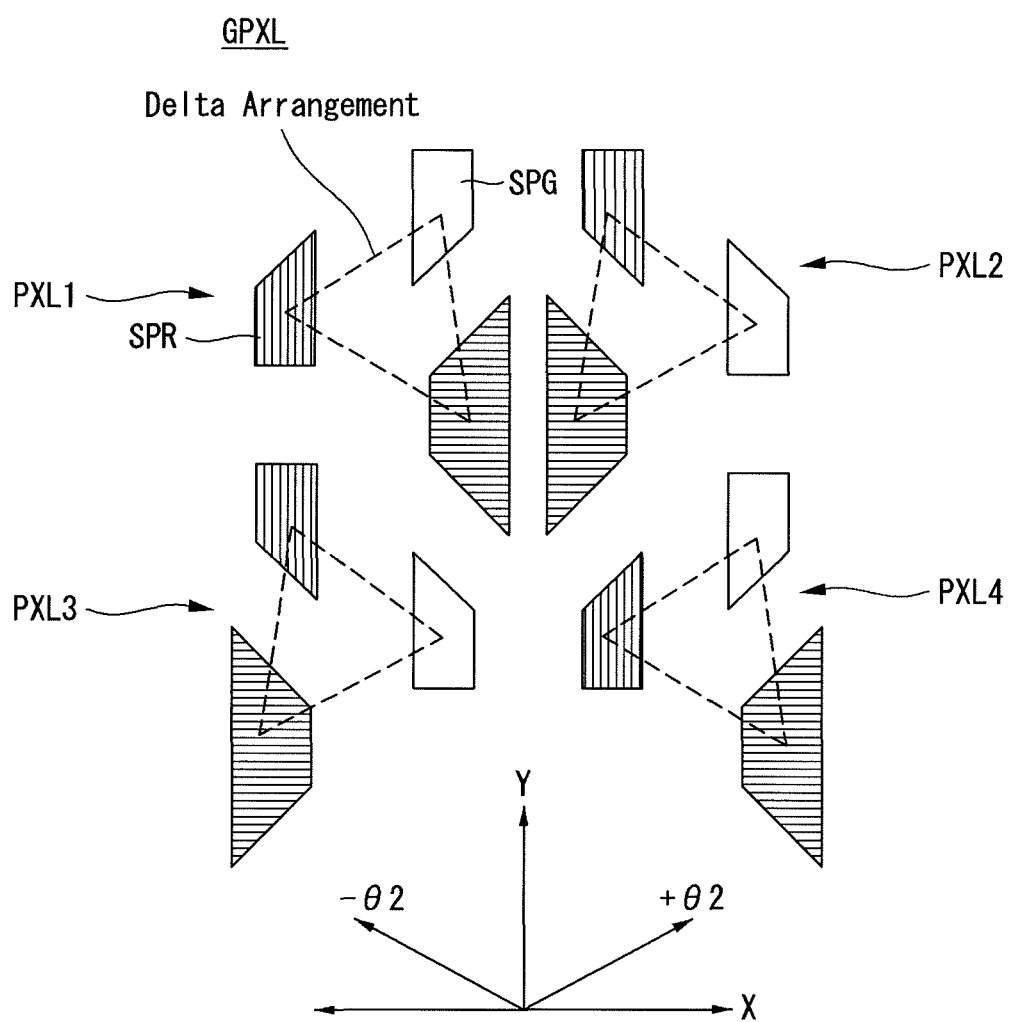
FIG. 10 illustrates one pixel group of a flat panel display device according to a third example embodiment of the invention.

FIG. 10 illustrates one pixel group of a flat panel display device according to a third example embodiment of the invention.

A pixel group GPXL shown in FIG. 10 is substantially the same as the pixel group GPXL shown in FIG. 3 in a delta arrangement structure of subpixels, except for the shape of the subpixels. In first to fourth unit pixels PXL1-PXL4 shown in FIG. 10, red and green subpixels SPR and SPG may have an asymmetrical quadrangle shape, and blue subpixels SPB may have a trapezoidal shape.

In each of the first and fourth unit pixels PXL1 and PXL4, a short side and a long side of the blue subpixel SPB are disposed in the Y-axis direction. An inclined side of the red subpixel SPR, which is not opposite to a first inclined side of the blue subpixel SPB, and an inclined side of the green subpixel SPG opposite the first inclined side of the blue subpixel SPB are disposed in a direction of a first inclined axis (i.e., +θ2-axis direction). The inclined sides of the red subpixels SPR of the first and fourth unit pixels PXL1 and PXL4 are positioned opposite a second inclined side of one of the blue subpixels SPB of the second and third unit pixels PXL2 and PXL3.

In each of the second and third unit pixels PXL2 and PXL3, a short side and a long side of the blue subpixel SPB are disposed in the Y-axis direction. An inclined side of the red subpixel SPR opposite a first inclined side of the blue subpixel SPB and an inclined side of the green subpixel SPG, which is not opposite to the first inclined side of the blue subpixel SPB, are disposed in a direction of a second inclined axis (i.e., −θ2-axis direction). The inclined sides of the green subpixels SPG of the second and third unit pixels PXL2 and PXL3 are positioned opposite a second inclined side of one of the blue subpixels SPB of the first and fourth unit pixels PXL1 and PXL4.

The long sides of the blue subpixels SPB of the first and second unit pixels PXL1 and PXL2 are positioned opposite each other, and the long sides of the blue subpixels SPB of the third and fourth unit pixels PXL3 and PXL4 are positioned opposite each other.

Among distances between the blue subpixels SPB of the first to fourth unit pixels PXL1-PXL4, a distance between the blue subpixels SPB of the first and second unit pixels PXL1 and PXL2 is shorter, and a distance between the blue subpixels SPB of the third and fourth unit pixels PXL3 and PXL4 is longer.

Figure 11:
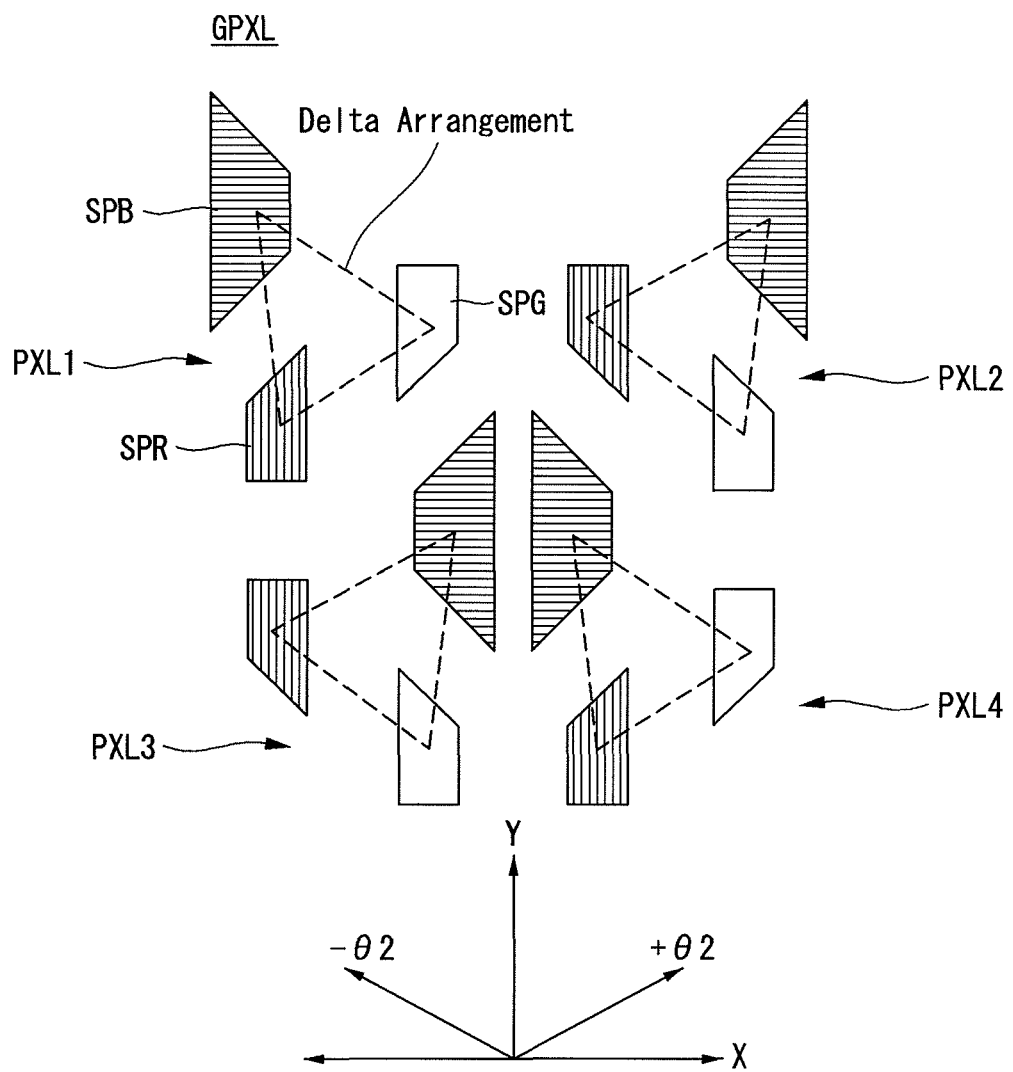
FIG. 11 illustrates a modification of a pixel group shown in FIG. 10.

FIG. 11 illustrates a modification of the pixel group shown in FIG. 10.

A pixel group GPXL shown in FIG. 11 is substantially the same as the pixel group GPXL shown in FIG. 7 in a delta arrangement structure of subpixels, except for the shape of the subpixels. In first to fourth unit pixels PXL1-PXL4 shown in FIG. 11, red and green subpixels SPR and SPG may have an asymmetrical quadrangle shape, and blue subpixels SPB may have a trapezoidal shape.

In each of the first and fourth unit pixels PXL1 and PXL4, a short side and a long side of the blue subpixel SPB are disposed in the Y-axis direction. An inclined side of the red subpixel SPR opposite a first inclined side of the blue subpixel SPB and an inclined side of the green subpixel SPG, which is not opposite to the first inclined side of the blue subpixel SPB, are disposed in a direction of a first inclined axis (i.e., +θ2-axis direction). The inclined sides of the green subpixels SPG of the first and fourth unit pixels PXL1 and PXL4 are positioned opposite a second inclined side of one of the blue subpixels SPB of the second and third unit pixels PXL2 and PXL3.

In each of the second and third unit pixels PXL2 and PXL3, a short side and a long side of the blue subpixel SPB are disposed in the Y-axis direction. An inclined side of the red subpixel SPR, which is not opposite to a first inclined side of the blue subpixel SPB, and an inclined side of the green subpixel SPG opposite the first inclined side of the blue subpixel SPB are disposed in a direction of a second inclined axis (i.e., −θ2-axis direction). The inclined sides of the red subpixels SPR of the second and third unit pixels PXL2 and PXL3 are positioned opposite a second inclined side of one of the blue subpixels SPB of the first and fourth unit pixels PXL1 and PXL4.

The short sides of the blue subpixels SPB of the first and second unit pixels PXL1 and PXL2 are positioned opposite each other, and the long sides of the blue subpixels SPB of the third and fourth unit pixels PXL3 and PXL4 are positioned opposite each other.

Among distances between the blue subpixels SPB of the first to fourth unit pixels PXL1-PXL4, a distance between the blue subpixels SPB of the first and second unit pixels PXL1 and PXL2 is longer, and a distance between the blue subpixels SPB of the third and fourth unit pixels PXL3 and PXL4 is shorter.

Figure 12:
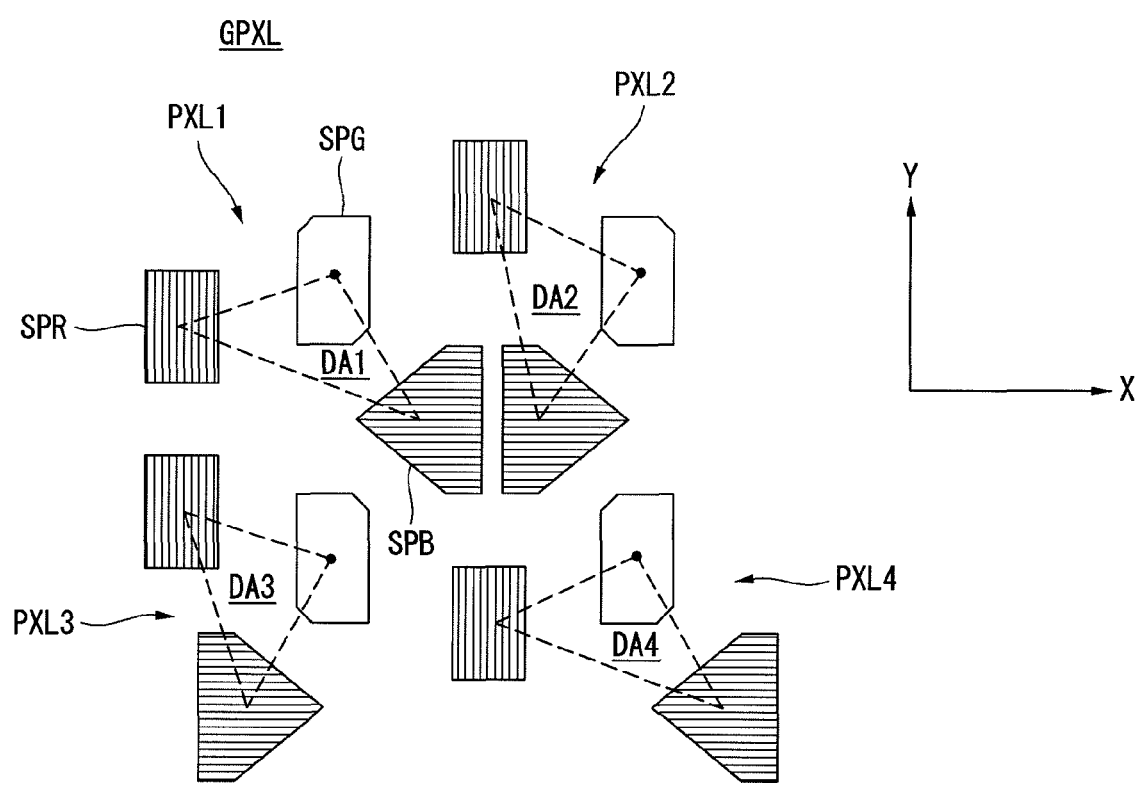
FIG. 12 illustrates one pixel group of a flat panel display device according to a fourth example embodiment of the invention.

FIG. 12 illustrates one pixel group of a flat panel display device according to a fourth example embodiment of the invention.

Subpixels of a pixel group GPXL shown in FIG. 12 are disposed in consideration of a human vision system in which the human perceives red and green better than blue. Because of limitations of the human vision system to see blue with as much resolution as red or green, it may be preferable, but not required, to keep the green subpixels on the most regular spacing, the red subpixels on the next most regular spacing, and the blue subpixels on the least regular spacing. An example of a subpixel layout that achieves the best or improved green uniformity is shown in FIG. 12. As shown in FIG. 12, the green subpixels SPG are on a regular spacing both vertically and horizontally, and the red and blue subpixels SPR, SPB are less regularly spaced. Hence, the excellent or improved image quality is obtained. The pixel group GPXL shown in FIG. 12 includes a first unit pixel PXL1, a second unit pixel PXL2 positioned adjacent to the first unit pixel PXL1 in the X-axis direction, a third unit pixel PXL3 positioned adjacent to the first unit pixel PXL1 in the Y-axis direction, and a fourth unit pixel PXL4 positioned adjacent to the second unit pixel PXL2 in the Y-axis direction.

The first unit pixel PXL1 includes a red subpixel SPR, a green subpixel SPG positioned at the lateral side of the red subpixel SPR, and a blue subpixel SPB positioned at the lower side of the green subpixel SPG, thereby forming a first delta arrangement DA1.

The second unit pixel PXL2 includes a red subpixel SPR, a green subpixel SPG positioned at the lateral side of the red subpixel SPR, and a blue subpixel SPB positioned at the lower side of the red subpixel SPR, thereby forming a second delta arrangement DA2.

The third unit pixel PXL3 includes a red subpixel SPR, a green subpixel SPG positioned at the lateral side of the red subpixel SPR, and a blue subpixel SPB positioned at the lower side of the red subpixel SPR, thereby forming a third delta arrangement DA3. The third delta arrangement DA3 is substantially the same as the second delta arrangement DA2.

The fourth unit pixel PXL4 includes a red subpixel SPR, a green subpixel SPG positioned at the lateral side of the red subpixel SPR, and a blue subpixel SPB positioned at the lower side of the green subpixel SPG, thereby forming a fourth delta arrangement DA4. The fourth delta arrangement DA4 is substantially the same as the first delta arrangement DA1.

In each of the first to fourth unit pixels PXL1-PXL4, the red subpixel SPR may have a rectangular shape in which long sides thereof are positioned in the Y-axis direction, the blue subpixel SPB may have a pentagonal shape having a pair of inclined sides divided from one vertex, and the green subpixel SPG may have a hexagonal shape having a pair of inclined sides, which are parallel to and opposite to each other. Among distances between the blue subpixels SPB of the first to fourth unit pixels PXL1-PXL4, a distance between the blue subpixels SPB of the second and third unit pixels PXL2 and PXL3 is the shortest, and a distance between the blue subpixels SPB of the first and fourth unit pixels PXL1 and PXL4 is the longest. Among distances between the red subpixels SPR of the first to fourth unit pixels PXL1-PXL4, a distance between the red subpixels SPR of the first and third unit pixels PXL1 and PXL3 is shorter, and a distance between the red subpixels SPR of the second and fourth unit pixels PXL2 and PXL4 is longer.

In the first to fourth unit pixels PXL1-PXL4, openings of the red subpixels SPR and openings of the green subpixels SPG are aligned along the Y-axis direction. Openings of the blue subpixels SPB are aligned along the X-axis direction and are staggered along the Y-axis direction.

Figure 13:
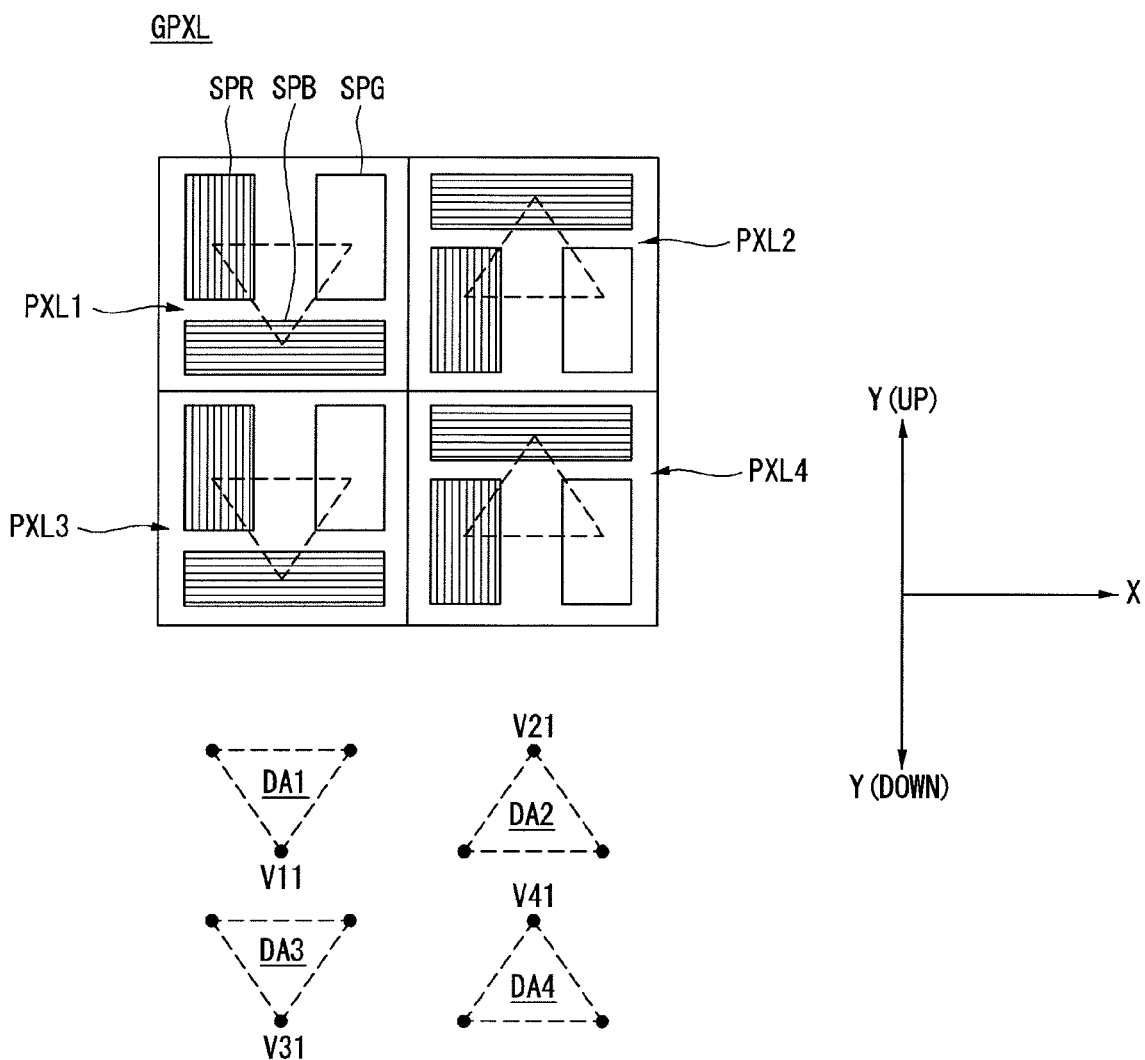
FIG. 13 illustrates one pixel group of a flat panel display device according to a fifth example embodiment of the invention.

FIG. 13 illustrates one pixel group of a flat panel display device according to a fifth example embodiment of the invention.

As shown in FIG. 13, a pixel group GPXL shown in FIG. 13 is configured so that subpixels of each unit pixel of the pixel group GPXL are entirely arranged in a shape close to a square so as to increase the aperture ratio at a high resolution. Openings of blue subpixels SPB of the unit pixels are arranged in zigzags along the X-axis direction.

More specifically, the pixel group GPXL shown in FIG. 13 includes a first unit pixel PXL1, a second unit pixel PXL2 positioned adjacent to the first unit pixel PXL1 in the X-axis direction, a third unit pixel PXL3 positioned adjacent to the first unit pixel PXL1 in the Y-axis direction, and a fourth unit pixel PXL4 positioned adjacent to the second unit pixel PXL2 in the Y-axis direction.

The first unit pixel PXL1 includes a red subpixel SPR, a green subpixel SPG positioned at the lateral side of the red subpixel SPR, and a blue subpixel SPB positioned at the lower side of the red and green subpixels SPR and SPG, thereby forming a first delta arrangement DA1. In a triangle structure of the first delta arrangement DA1 obtained by connecting central points (or internal points) of the red, green, and blue subpixels SPR, SPG, and SPB to one another, a 1-1 vertex V11 corresponds to the blue subpixel SPB.

The second unit pixel PXL2 includes a red subpixel SPR, a green subpixel SPG positioned at the lateral side of the red subpixel SPR, and a blue subpixel SPB positioned at the upper side of the red and green subpixels SPR and SPG, thereby forming a second delta arrangement DA2. In a triangle structure of the second delta arrangement DA2 obtained by connecting central points (or internal points) of the red, green, and blue subpixels SPR, SPG, and SPB to one another, a 2-1 vertex V21 corresponds to the blue subpixel SPB.

The third unit pixel PXL3 has substantially the same subpixel arrangement structure as the first unit pixel PXL1, thereby forming a third delta arrangement DA3. In a triangle structure of the third delta arrangement DA3 obtained by connecting central points (or internal points) of red, green, and blue subpixels SPR, SPG, and SPB to one another, a 3-1 vertex V31 corresponds to the blue subpixel SPB.

The fourth unit pixel PXL4 has substantially the same subpixel arrangement structure as the second unit pixel PXL2, thereby forming a fourth delta arrangement DA4. In a triangle structure of the fourth delta arrangement DA4 obtained by connecting central points (or internal points) of red, green, and blue subpixels SPR, SPG, and SPB to one another, a 4-1 vertex V41 corresponds to the blue subpixel SPB.

In each of the first to fourth unit pixels PXL1-PXL4, the red and green subpixels SPR and SPG may have a rectangular shape in which long sides thereof are positioned in the Y-axis direction, and the blue subpixel SPB may have a rectangular shape in which long sides thereof are positioned in the X-axis direction. The subpixels SPR, SPG, and SPB of each unit pixel may be arranged so that each unit pixel entirely forms a square shape. The 2-1 and 4-1 vertices V21 and V41 are positioned upward in the Y-axis direction, and the 1-1 and 3-1 vertices V11 and V31 are positioned downward in the Y-axis direction.

As described above, the subpixel arrangement structure of the flat panel display device according to the embodiments of the invention may prevent a reduction in display quality while increasing the aperture ratio and the luminance. For example, the flat panel display device according to the embodiments of the invention may obtain a luminance of 150 cd/m$^2$ under the same process conditions as the existing RGB stripe structure without causing the reduction in display quality, as compared to a luminance of 100 cd/m$^2$ obtained in the existing RGB stripe structure. Additionally, references to elements being opposite may refer to such elements facing each other. Such opposite elements may also be at close proximity.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A subpixel arrangement structure for a display device, comprising:
    a plurality of pixel groups each including four unit pixels, each of the unit pixels having a red subpixel, a green subpixel and a blue subpixel which form a delta arrangement structure,
    wherein major axes of openings of the red subpixels of the pixel groups are substantially aligned along only a direction of a column axis, and major axes of openings of the green subpixels of the pixel groups are substantially aligned along only a direction of a column axis,
    wherein blue subpixels neighboring each other along a direction of a row axis in the pixel groups are disposed so that major axes of openings of the blue subpixels substantially are aligned along only a direction of the row axis that is perpendicular to the column axis, and other blue subpixels neighboring each other along the direction of the column axis in the pixel groups are disposed so that the openings of the blue subpixels are arranged in zigzags along the direction of the column axis,
    wherein one of the plurality of pixel groups includes a first unit pixel, a second unit pixel positioned adjacent to the first unit pixel in the direction of the row axis, a third unit pixel positioned adjacent to the first unit pixel in the direction of the column axis, and a fourth unit positioned adjacent to the second unit pixel in the direction of the column axis,
    wherein a distance between the first and third red subpixels of first and third unit pixels is the shortest among those of the first through fourth unit pixels,
    wherein a distance between the second and fourth green subpixels of second and fourth unit pixels is the shortest among those of the first through fourth unit pixels, and wherein a distance between the first and second blue subpixels of the first and second unit pixels is the shortest among those of the first through fourth unit pixels.

2. The subpixel arrangement structure of claim 1, wherein the first unit pixel includes a first red subpixel, a first green subpixel positioned at a lateral side of the first red subpixel, and a first blue subpixel positioned at a lower side of the first green subpixel, thereby forming a first delta arrangement,
wherein the second unit pixel includes a second red subpixel, a second green subpixel positioned at a lateral side of the second red subpixel, and a second blue subpixel positioned at a lower side of the second red subpixel, thereby forming a second delta arrangement,
wherein the third unit pixel includes a third red subpixel, a third green subpixel positioned at a lateral side of the third red subpixel, and a third blue subpixel positioned at a lower side of the third red subpixel, thereby forming a third delta arrangement,
wherein the fourth unit pixel includes a fourth red subpixel, a fourth green subpixel positioned at a lateral side of the fourth red subpixel, and a fourth blue subpixel positioned at a lower side of the fourth green subpixel, thereby forming a fourth delta arrangement.

3. The subpixel arrangement structure of claim 2, wherein the first to fourth red subpixels and the first to fourth green subpixels have a rectangular shape in which long sides thereof are positioned in the direction of the column axis, and the first to fourth blue subpixels have a rectangular shape in which long sides thereof are positioned in the direction of the row axis,
wherein the distance between the first and second blue subpixels of the first and second unit pixels is less than a distance between the third and fourth blue subpixels of the third and fourth unit pixels.

4. The subpixel arrangement structure of claim 2, wherein vertices of the first and second delta arrangements arranged along the direction of the row axis face in opposite directions,
wherein vertices of third and fourth delta arrangements arranged along the direction of the row axis face each other.

5. The subpixel arrangement structure of claim 4, wherein the first to fourth red subpixels and the first to fourth green subpixels have a parallelogram shape, and the first to fourth blue subpixels have a triangle shape.

6. The subpixel arrangement structure of claim 4, wherein the first to fourth red subpixels and the first to fourth green subpixels have an asymmetrical quadrangle shape, and the first to fourth blue subpixels have a trapezoidal shape.

7. The subpixel arrangement structure of claim 1, wherein the first unit pixel includes a first red subpixel, a first blue subpixel positioned at an upper side of the first red subpixel, and a first green subpixel positioned at a lateral side of the first red subpixel, thereby forming a first delta arrangement,
wherein the second unit pixel includes a second red subpixel, a second green subpixel positioned at a lateral side of the second red subpixel, and a second blue subpixel positioned at an upper side of the second green subpixel, thereby forming a second delta arrangement,
wherein the third unit pixel includes a third red subpixel, a third green subpixel positioned at a lateral side of the third red subpixel, and a third blue subpixel positioned at an upper side of the third green subpixel, thereby forming a third delta arrangement, which is substantially the same as the second delta arrangement,
wherein the fourth unit pixel includes a fourth red subpixel, a fourth blue subpixel positioned at an upper side of the fourth red subpixel, and a fourth green subpixel positioned at a lateral side of the fourth red subpixel, thereby forming a fourth delta arrangement, which is substantially the same as the first delta arrangement.

8. The subpixel arrangement structure of claim 7, wherein the first to fourth red subpixels and the first to fourth green subpixels have a polygonal shape, and the first to fourth blue subpixels have a hexagonal shape,
wherein a distance between the first and second blue subpixels of the first and second unit pixels is greater than a distance between the third and fourth blue subpixels of the third and fourth unit pixels.

9. The subpixel arrangement structure of claim 7, wherein vertices of the first and second delta arrangements arranged along the direction of the row axis face each other,
wherein vertices of third and fourth delta arrangements arranged along the direction of the row axis face in opposite directions.

10. The subpixel arrangement structure of claim 9, wherein the first to fourth red subpixels and the first to fourth green subpixels have a parallelogram shape, and the first to fourth blue subpixels have a triangle shape.

11. The subpixel arrangement structure of claim 9, wherein the first to fourth red subpixels and the first to fourth green subpixels have an asymmetrical quadrangle shape, and the first to fourth blue subpixels have a trapezoidal shape.

12. The subpixel arrangement structure of claim 1, wherein one of the plurality of pixel groups includes a first unit pixel including subpixels arranged in a first delta arrangement, a second unit pixel, including subpixels arranged in a second delta arrangement, positioned adjacent to the first unit pixel in the direction of the row axis, a third unit pixel, including subpixels arranged in a third delta arrangement, positioned adjacent to the second unit pixel in the direction of the column axis, and a fourth unit pixel, including subpixels arranged in a fourth delta arrangement, positioned adjacent to the third unit pixel in the direction of the row axis,
wherein green subpixels included in the one pixel group are disposed to be spaced apart from one another at the most uniform distance, red subpixels included in the one pixel group are disposed to be spaced apart from one another at the next most uniform distance, and blue subpixels included in the one pixel group are disposed to be spaced apart from one another at the most irregular distance.

13. The subpixel arrangement structure of claim 12, wherein the red subpixels of the first to fourth unit pixels have a rectangular shape in which long sides thereof are positioned in the direction of the column axis, the blue subpixels of the first to fourth unit pixels have a pentagonal shape, and the green subpixels of the first to fourth unit pixels have a hexagonal shape,
wherein vertices on the green subpixels in the first and second delta arrangements face to the right along the direction of the column axis,
wherein vertices on the green subpixels in the third and fourth delta arrangements face to the left along the direction of the row axis.

14. The subpixel arrangement structure of claim 1, wherein the first unit pixel includes a first red subpixel, a first green subpixel positioned at a lateral side of the first red subpixel, and a first blue subpixel positioned at a lower side of the first red and green subpixels, thereby forming a first delta arrangement,
wherein the second unit pixel includes a second red subpixel, a second green subpixel positioned at a lateral side of the second red subpixel, and a second blue subpixel positioned at an upper side of the second red and green subpixels, thereby forming a second delta arrangement, wherein the third unit pixel includes a third red subpixel, a third green subpixel positioned at a lateral side of the third red subpixel, and a third blue subpixel positioned at a lower side of the third red and green subpixels, thereby forming a third delta arrangement, that is substantially the same as the first delta arrangement, wherein the fourth unit pixel includes a fourth red subpixel, a fourth green subpixel positioned at a lateral side of the fourth red subpixel, and a fourth blue subpixel positioned at an upper side of the fourth red and green subpixels, thereby forming a fourth delta arrangement, that is substantially the same as the second delta arrangement.

15. The subpixel arrangement structure of claim 14, wherein the first to fourth red subpixels and the first to fourth green subpixels have a rectangular shape in which long sides thereof are positioned in the direction of the column axis, and the first to fourth blue subpixels have a rectangular shape in which long sides thereof are positioned in the direction of the row axis, wherein the subpixels of each of the first to fourth unit pixels are arranged so that each unit pixel entirely forms a square shape, wherein vertices on the blue subpixels in the first and third delta arrangements are positioned downward in the direction of the column axis, wherein vertices on the blue subpixels in the second and fourth delta arrangements are positioned upward in the direction of the column axis.

16. The subpixel arrangement structure of claim 1, wherein two of the four unit pixels are symmetric with respect to a first axis, and the other two of the four pixels unit pixels are symmetric with respect to a second axis.

17. The subpixel arrangement structure of claim 16, wherein the first and the second axis are one of the column axis, the row axis and a diagonal axis.

* * * * *